US011532546B2

(12) United States Patent
Dinh et al.

(10) Patent No.: US 11,532,546 B2
(45) Date of Patent: Dec. 20, 2022

(54) FRINGE CAPACITOR ARRANGED BASED ON METAL LAYERS WITH A SELECTED ORIENTATION OF A PREFERRED DIRECTION

(71) Applicant: NXP B.V., Eindhoven (NL)

(72) Inventors: Viet Thanh Dinh, Leuven (DE); Bartholomeus Wilhelmus Christiaan Hovens, Best (NL); Marina Vroubel, Nijmegen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/239,884

(22) Filed: Apr. 26, 2021

(65) Prior Publication Data

US 2022/0344257 A1 Oct. 27, 2022

(51) Int. Cl.
*H01L 23/522* (2006.01)
*H01L 49/02* (2006.01)
*H01L 27/08* (2006.01)

(52) U.S. Cl.
CPC .......... *H01L 23/5223* (2013.01); *H01L 28/60* (2013.01); *H01L 27/0805* (2013.01); *H01L 2924/0002* (2013.01)

(58) Field of Classification Search
CPC ............... H01L 23/5223; H01L 28/60; H01L 2924/0002; H01L 27/0805
See application file for complete search history.

(56) References Cited

U.S. PATENT DOCUMENTS

| 8,856,715 | B1* | 10/2014 | Stephens | G06F 30/394 |
| | | | | 716/122 |
| 2013/0320494 | A1 | 12/2013 | Zhu et al. | |
| 2013/0342955 | A1* | 12/2013 | Zhang | H01L 27/0805 |
| | | | | 29/25.03 |
| 2014/0203401 | A1* | 7/2014 | Li | H01L 28/91 |
| | | | | 257/532 |

FOREIGN PATENT DOCUMENTS

| EP | 0905792 A2 | 3/1999 |
| EP | 0905792 A3 | 2/2000 |

OTHER PUBLICATIONS

Shi et al., "Evolution and Optimization of BEOL MOM Capacitors Across Advanced CMOS Nodes," IEEE, 2018 48th European Solid-State Device Research Conference (ESSDERC), 4 pages.

* cited by examiner

*Primary Examiner* — Patricia D Valenzuela

(57) ABSTRACT

A fringe capacitor comprises a plurality of unidirectional metal layers, wherein an orientation of a preferred direction of each of the unidirectional metal layers is in a same direction. First fingers of the fringe capacitor are formed in a first layer of the unidirectional metal layers, the first fingers being interdigitated and having a direction parallel to the orientation of the preferred direction. Second fingers of the fringe capacitor are formed in a second layer of the unidirectional metal layers, the second fingers being interdigitated and having a direction parallel to the orientation of the preferred direction, the first layer and the second layer separated by at least a layer of not having the orientation of the preferred direction and not having fingers of the fringe capacitor.

18 Claims, 5 Drawing Sheets

FRINGE CAPACITOR ARRANGED BASED ON METAL LAYERS WITH A SELECTED ORIENTATION OF A PREFERRED DIRECTION

BACKGROUND

Electronic devices comprise a variety of integrated circuits such as analog-to-digital converters, voltage controlled oscillators, and power amplifiers. Some circuits of the electronic devices include at least one metal-oxide-metal (MOM) fringe capacitor or more generally a metal-dielectric-metal fringe capacitor.

BRIEF DESCRIPTION OF THE DRAWINGS

Throughout the description, similar reference numbers may be used to identify similar elements.

DETAILED DESCRIPTION

Figure 1:
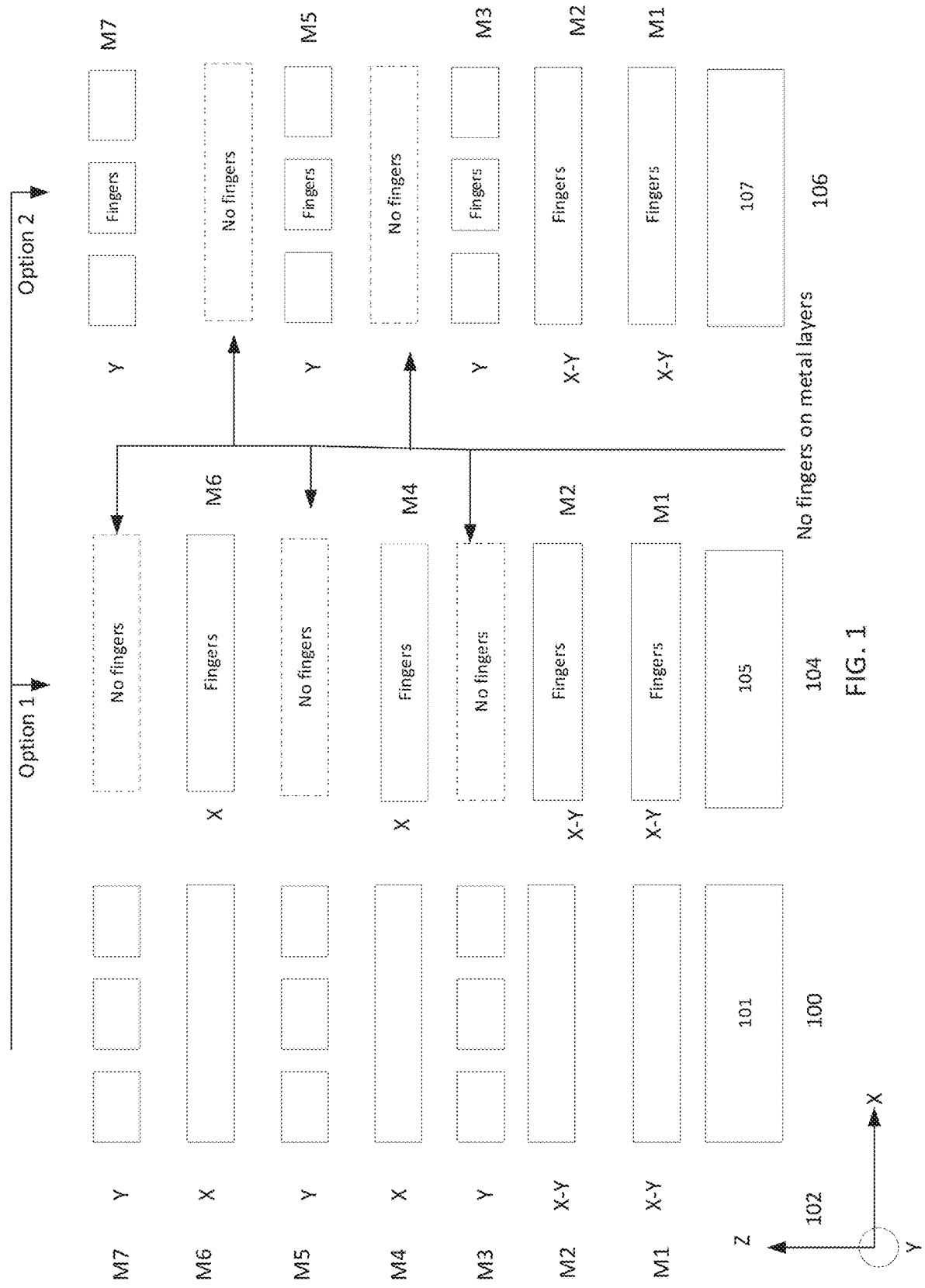
FIG. 1 illustrates example partial cross sectional views of semiconductor dies each with metal layers located above a substrate.

In semiconductor fabrication, a semiconductor die (also referred to as an integrated circuit) comprises a plurality of metal layers located over a substrate of a semiconductor material. The metal layers are utilized for providing electrical coupling between semiconductor devices such as transistors in the substrate and die external terminals such as pads. A metal layer has metal traces and some metal layers are fabricated such that a smallest feature size of the metal traces is available in only one direction. For example, with a metal process known as 16 nm FinFET compact (16FFC), the smallest trace width and spacing of 40 nm is available in only one direction along the plane of the metal layer. This direction is sometimes called the preferred direction of the metal layer. In a direction orthogonal to the preferred direction on the metal layer referred to as a non-preferred direction, the smallest trace width and spacing is 80 nm. For some process technologies, there is no preferred direction in a metal layer. For example, in a 90 nm pitch metal process, the smallest trace width and spacing are each 90 nm, regardless of direction along the plane of the metal layer.

A metal layer having a preferred direction and non-preferred direction may be referred to as being unidirectional, and a metal layer having no preferred direction may be referred to as bidirectional. In manufacturing an integrated circuit with multiple metal layers stacked together, it is common practice for the lower metal layers to be bidirectional, and for the higher metal layers to be unidirectional. For example, in an integrated circuit chip employing six metal layers, the first two lowest metal layers may be bidirectional, and the four upper metal layers stacked above the first two lowest metal layers may be unidirectional. In an integrated circuit chip employing seven metal layers, the first three lowest metal layers may be bidirectional, and the four upper metal layers may be unidirectional.

It is a common design practice for adjacent unidirectional metal layers stacked together to have their preferred directions orthogonal to one another. Having adjacent layers with orthogonal preferred directions allows for higher density placement for routing interconnects. The term "adjacent" when referring to a first layer and a second layer herein is to be interpreted to mean that the first and second layers are formed on a semiconductor die such that there is no other metal layer formed between them.

Embodiments described herein are directed to a fringe capacitor arranged based on metal layers with a selected orientation of a preferred direction. In examples, fingers of the fringe capacitor are only formed in metal layers with preferred directions oriented along a same axis. Further, fingers of the fringe capacitor are oriented in parallel to the preferred directions of the metal layers on which the fringe capacitors are formed. The preferred direction is one of two directions which are orthogonal to each other resulting in two different options of fringe capacitors being formed and available for circuit designers to use. Advantageously, the two options of fringe capacitors being formed each have a same capacitance. Further, the fringe capacitor has a high density because the fingers of the fringe capacitor are parallel to the preferred direction and with feature size of the preferred direction which is very fine (or very small) compared to the non-preferred direction. Fingers associated with the layers of the fringe capacitor can be included or not included so that the pattern of fingers are arranged in the same regular way in the layers of the fringe capacitor. Further, length, width, or both length and width of the fingers associated with the layers of the fringe capacitor can be changed to adjust capacitance of the fringe capacitor so that the pattern of fingers are arranged in the same regular way in the layers of the fringe capacitor.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", "an example", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

FIG. 1 illustrates an example partial cross sectional views of semiconductor dies 100, 104, and 106 with metal layers located above a respective substrate 101, 105, 107. The substrates include a semiconductor material (e.g. silicon, silicon germanium, gallium nitride) where semiconductor devices such as transistors (not shown) formed in the substrate.

In the metal layers shown for semiconductor die 100, the first lower thin metal layers (M1, M2) may be bidirectional, then next metal layers (M3-M7) may be unidirectional. In examples, the metal layers may have metal traces made of copper or aluminum and/or a dielectric material made of an oxide. For purposes of describing embodiments, coordinate system 102 provides a reference where the X-axis and Z-axis lie in the plane of the illustration, and the Y-axis points into or out of the plane of the illustration. A metal layer formed in the X-Y plane may have a metal trace along an X axis and/or a metal trace along a Y axis. For the unidirectional metal layers, a direction of a metal trace with a finer pitch may be the preferred direction and a direction of a metal trace with a coarser pitch may be the non-preferred direction. For each layer in the example illustration, the preferred direction may be indicated by a direction of the axis such that M4 and M6 have a preferred direction oriented in the X direction and M5 and M7 have a preferred direction oriented in the Y direction. The letter "X" or "Y" placed next to a layer may indicate the orientation of the preferred direction for the layer and a combination X-Y placed next to a layer may indicate that the layer is bidirectional in the example die 100. The axes X, Y, and Z may be arranged in different directions as well and the die 100 may have less or more metal layers or different combinations of layers with preferred and non-preferred directions. In some embodiments, the metal layers may be of different thicknesses. For example, in some embodiments, the upper metal layers may have a greater thickness than the lower metal layers. In some embodiments, the semiconductor die 100 may not have bidirectional metal layers.

Not shown in FIG. 1 are the layers of dielectric material located between the metal layers of a die referred to inter-dielectric layers. In one embodiment, these dielectric layers are formed from an oxide material formed during a Tetra-EthylOrthoSilicate (TEOS) process. The dielectric layers include conductive vias (not shown) formed in openings in the dielectric material for interconnecting conductive structures of one metal layer with conductive structures of another metal layer. Also not shown in FIG. 1 are the dielectric material separating the metal structures within a layer referred to as intra-dielectric material.

Die 104 and 106 each include metal layers located above respective substrate 105, 107 with a specific metal patterning on one or more layers to form fringe capacitors. A fringe capacitor as described herein comprises one or more metal layers with a plurality of conductors arranged as fingers separated by an intra-dielectric material (not shown) on the one or more metal layers. For a metal layer, a number of fingers are placed next to each other on the same plane and separated by dielectric (not shown); these fingers include a set of fingers; a first set of fingers is formulated on one metal layer, then a second set of fingers are formulated on a second metal layer in an example. In examples, fringes of the fingers generates a capacitance. Further, in examples, the metal layer on which the fingers of the fringe capacitor are formed depends on whether the metal layer is a unidirectional metal layer and whether the preferred direction is in the X direction or Y direction.

In one embodiment, a fringe capacitor of die 104 has unidirectional metal layers with a preferred direction in an X direction with fingers formed thereon. Fingers of the fringe capacitor are oriented in the X direction in the unidirectional metal layers. No patterned metal fingers of the fringe capacitor are formed in the unidirectional metal layers with a preferred direction in an Y direction. The axes X, Y, and Z may be arranged in different directions as well and the fringe capacitor of die 104 may have less or more metal layers or different combinations of layers with preferred and non-preferred directions such as 6, 7, 8, 11, 12, 13 layers for advanced complementary metal oxide semiconductor (CMOS) processing.

In another embodiment, a fringe capacitor of die 106 has unidirectional metal layers with a preferred direction in a Y direction and fringe capacitors formed thereon. Fingers of the fringe capacitor are oriented in the Y direction in the unidirectional metal layers. No patterned metal fingers of the fringe capacitor are formed in the unidirectional metal layers with a preferred direction in an X direction. The axes X, Y, and Z may be arranged in different directions as well and the fringe capacitor of die 106 may have less or more metal layers or different combinations of layers with preferred and non-preferred directions such as 6, 7, 8, 11, 12, 13 layers for advanced complementary metal oxide semiconductor (CMOS) processing.

In yet another embodiments, the fringe capacitor 104, 106 may not have bidirectional metal layers and only the unidirectional metal layers described above.

The fringe capacitor of die 104 and die 106 may be formed in a same or different fabrication process in a same or different die. Two different options of fringe capacitors shown in die 104, 106 may be selected for use by circuit designers in layout software with a same capacitance but different orientations of fingers of the fringe capacitors which increase flexibility in design. The fringe capacitor of die 104, 106 is an alternative option (not shown) to forming a fringe capacitor with each metal layer adjacent to each other having fingers oriented in a same direction and a pitch of the non-preferred direction. The alternative option has less capacitor density and larger feature size. Because of the smaller feature size, the fringe capacitors of die 104, 106 have a two times higher overall capacitance density (3-4 fF/micrometer$^2$ vs 1.5-2 fF/micrometer$^2$) compared to the alternative option even though fingers are not formed in each adjacent metal layer.

Figure 2:
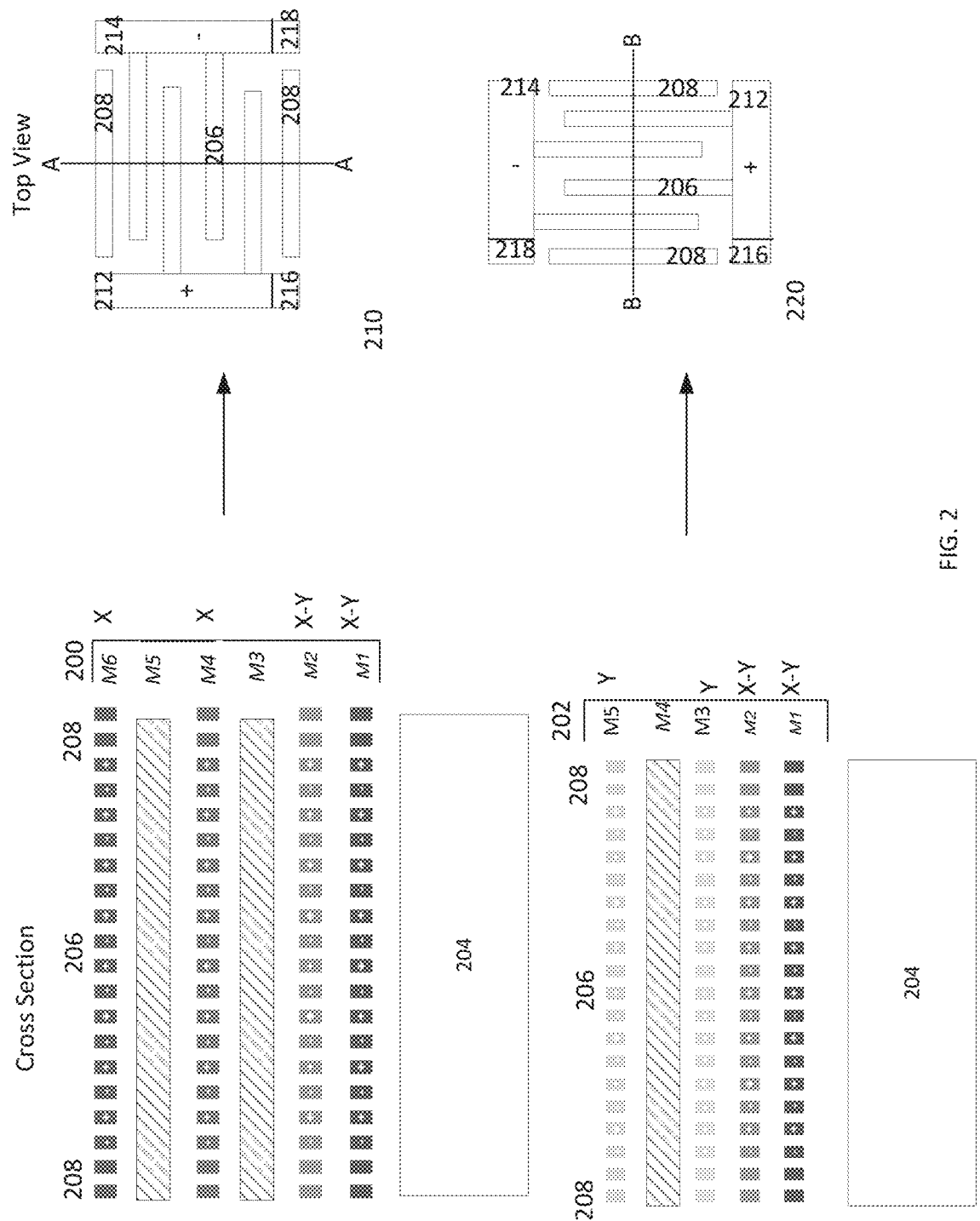
FIG. 2 illustrates in more detail example partial cross sectional views of metal layers located over a substrate and arranged as fringe capacitors.

FIG. 2 illustrates in more detail example partial cross sectional views of fringe capacitors 200, 202 having the plurality of metal layers located over a substrate 204. In these examples and according to a fabrication process, metal M1 and M2 may be bidirectional layers and M3 to M6 may be unidirectional layers associated with a fabrication process. Metal layers M3 and M5 may have a preferred direction in the X direction and metal layers M4 and M6 may have a preferred direction in the Y direction. The fringe capacitors 200, 202 may have a regular structure of fingers all oriented in a same direction above the substrate 204.

In one example, fringe capacitor 200 may include fingers on metal layers M4, M6 with a preferred direction in the X direction and metal layers M3, M5 with a preferred direction in the Y direction where no fingers of the fringe capacitor 202 are formed. The fingers of the fringe capacitor in a unidirectional layer with a preferred direction in the X direction may be arranged in the X direction with a spacing between fingers defined by a pitch in the preferred direction and separated by a dielectric. Ends of the fingers are shown as 206. Each of fingers may be associated with a positive or negative electrode in the metal layer. In examples one or more dummy fingers 208 may be arranged on either side of the fingers 206 and the dummy fingers 208 may be floating to generate a uniform electric field around the fingers 206 associated with the positive or negative electrode. Ends of the dummy fingers 208 are shown that do not have a + or − symbol.

The fringe capacitor 200 may have a regular pattern of fingers 206 all oriented in a same direction. In this regard, the fingers in the bidirectional layers may be oriented in the same direction as the fingers in the patterned unidirectional layers. Top view 210 shows an example of one of the patterned unidirectional layers in the fringe capacitor 200 such that a cross section along line A-A corresponds to one of the layers in the fringe capacitor 200 with fingers. The top view 210 includes a positive metal trace 212 along the Y non-preferred direction and a negative metal trace 214 along a Y non-preferred direction and fingers of the fringe capacitor 200 arranged along an X preferred direction which are coupled to one of the positive metal trace 212 or the negative metal trace 214. The fingers coupled to the positive metal trace 212 may have a positive polarity and the fingers coupled to the negative metal trace 214 may have a negative polarity. Further, the fingers may be interdigitated and separated by a dielectric material in the layer. The fingers may have a pitch of the metal trace in the X preferred direction.

In another example, fringe capacitor 202 may include fingers in metal layers M3, M5 with a preferred direction in the Y direction and metal layer M4 with a preferred direction in the X direction where no fingers of the fringe capacitor 202 are formed. The fingers of the fringe capacitor in a unidirectional layer with a preferred direction in the Y direction may be arranged in the Y direction with a spacing between fingers defined by a pitch in the preferred direction and separated by a dielectric. Ends of the fingers are shown as 206. Each of fingers may be coupled to a positive or negative electrode in the metal layer. In examples one or more dummy fingers 208 may be arranged on either side of the fingers 206, e.g., a periphery of the fingers coupled to the positive or negative electrode, and the dummy fingers 208 may be floating to generate a uniform electric field around the fingers 206 associated with the positive or negative electrode. Ends of the dummy fingers 208 are shown.

The fringe capacitor 202 may have a regular pattern of fingers 206 all oriented in a same direction. In this regard, the fingers in the bidirectional layers may be oriented in the same direction as the fingers in the unidirectional layers. Top view 220 shows an example of one of the unidirectional layers in the fringe capacitor 202 such that a cross section along line B-B corresponds to one of the layers in the fringe capacitor 202 with fingers. The top view 220 includes a positive metal trace 212 along the X non-preferred direction and a negative metal trace 214 along a X non-preferred direction and fingers of the fringe capacitor 202 arranged along an Y preferred direction which are coupled to one of the positive metal trace 212 or the negative metal trace 214. The fingers coupled to the positive metal trace 212 may have a positive polarity and the fingers coupled to the negative metal trace 214 may have a negative polarity. Further, the fingers may be interdigitated and separated by an intra-dielectric material. The fingers may have a pitch of the metal trace in the Y preferred direction. The cross sections 200, 202 as shown may be separated by a 90 degree rotation.

The metal layers on which the fingers of the fringe capacitors are arranged in the X or Y preferred direction are also stackable (or sandwiched) with metal layers without any fingers. In examples, the positive metal trace 212 in each metal layer may be electrically coupled together though a via (not shown) in an inter-dielectric layer of the fringe capacitor 200 above or below 216 and the negative metal trace 214 in each metal layer may be electrically coupled together though a via (not shown) in an inter-dielectric layer of the fringe capacitor 200 above or below 218 to form the fringe capacitor 200 with the positive and negative terminal. In examples, the positive metal trace 212 in each metal layer may be electrically coupled together though a via (not shown) in an inter-dielectric layer of the fringe capacitor 202 above or below 216 on the positive metal trace 212 and the negative metal 214 trace in each metal layer may be electrically coupled together though a via (not shown) in an inter-dielectric layer of the fringe capacitor 202 above or below 218 to form the fringe capacitor 202 with the positive and negative terminal. The capacitance of each fringe capacitor may be the same or similar even though the fingers may be oriented in different directions.

Figure 3:
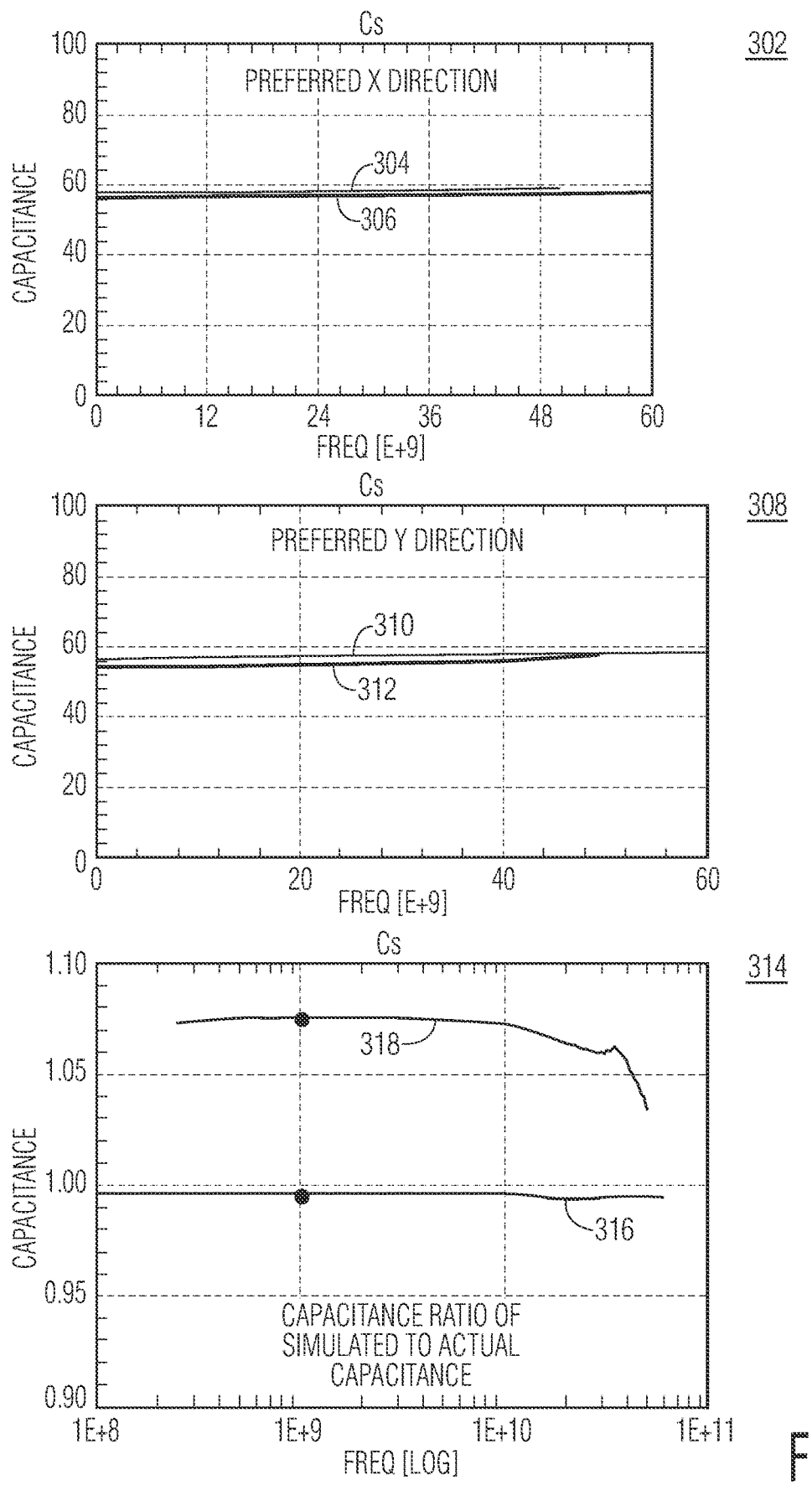
FIG. 3 shows an example actual capacitance and simulated capacitance as a function of frequency for the fringe capacitors in FIG. 2.

FIG. 3 shows an example of actual capacitance and simulated capacitance as a function of frequency for the fringe capacitor in FIG. 2. Graph 302 shows actual capacitance 304 in a test chip and simulated capacitance 306 by test software as a function of frequency for the fringe capacitor with fingers arranged in the X preferred direction. Graph 308 shows actual capacitance 310 and simulated capacitance 312 as a function of frequency for the fringe capacitor with fingers arranged in the Y preferred direction. A ratio between the fringe capacitance with fingers arranged in the X preferred direction and the fringe capacitance with fingers arranged in the Y preferred direction is shown in graph 314 for the actual measurement and simulated capacitance. The ratio for the simulated capacitance is shown by curve 316 and the ratio of the actual capacitance is shown by curve 318. The curves 316, 318 indicate that the capacitance of the different fringe capacitor varies by approximately 7 percent in practice and is larger than the variation shown in simulation. This difference is small enough to be easily adjusted. To compensate for the difference in capacitance, a length of the fingers along the preferred direction, a width of the fingers, or thickness of a metal layer may be adjusted to achieve a same capacitance for the two fringe capacitors with fingers arranged in the X or Y preferred directions without affecting layout of a circuit design in examples.

Figure 4:
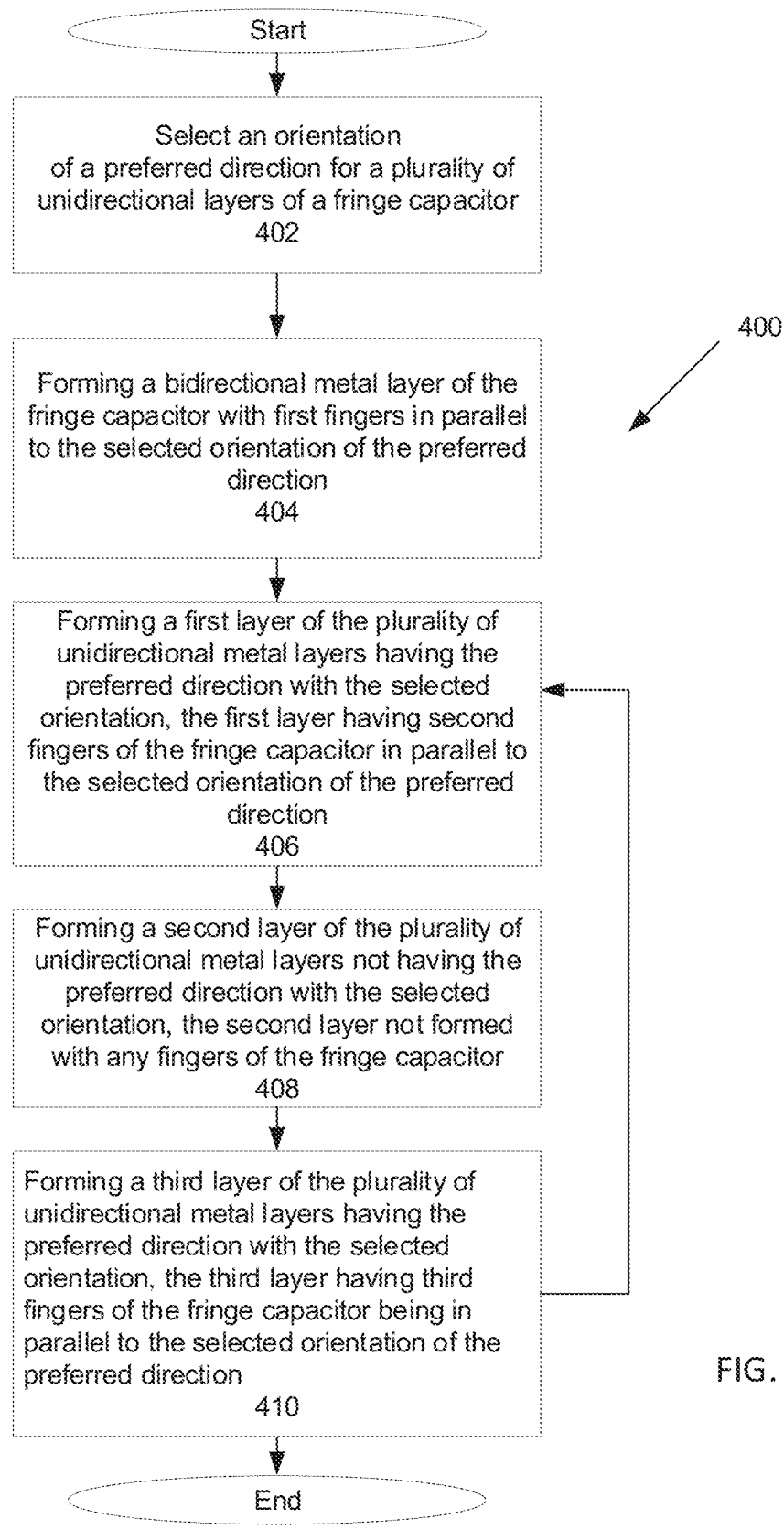
FIG. 4 illustrates an example method for forming the example fringe capacitor.

FIG. 4 illustrates an example method 400 of forming the example fringe capacitor. Referring to step 402, an orientation of a preferred direction for a plurality of unidirectional layers of a fringe capacitor may be selected. A bidirectional metal layer may have no preferred direction such that pitch of metal traces in the bidirectional metal layer may be the same in orthogonal (e.g., perpendicular) directions but a unidirectional metal layer may have a preferred direction which has a smaller pitch of traces than a non-preferred direction. Referring to step 404, a bidirectional metal layer of the fringe capacitor is formed with first fingers in parallel to the selected orientation of the preferred direction. Lithographic techniques are used to form the fingers which include a masking and etching process for processing the metal and dielectric layers. In some examples, the bidirectional metal layer may not be formed when the fringe capacitor does not have such a layer. Referring to step 406, a first layer of the plurality of unidirectional metal layers having a preferred direction with the selected orientation is formed, the first layer having second fingers of the fringe capacitor in parallel to the selected orientation of the preferred direction. At step 408, a second layer of the plurality of unidirectional metal layers not having the preferred direction with the selected orientation is formed, the second layer not formed with any fingers of the fringe capacitor. In examples, the second layer may be arranged on and adjacent to the first layer. The first and second layer may be formed with a lithographic process where masking and etching for processing the metal and dielectric layers may result in fingers or no fingers being formed. In some examples, the masking and etching may result in a metal line such as 214 or 212 formed in the second layer to facilitate the connection between layers through a via in an inter-dielectric layer. At step 410, a third layer of the plurality of unidirectional metal layers having a preferred direction with the selected orientation is formed, the third layer having third fingers of the fringe capacitor being in parallel to the selected orientation of the preferred direction. In examples, the third layer may be arranged on and adjacent to the second layer. Steps 406, 408, and 410 may be repeated one or more times to form the fringe capacitor depending on a number of metal layers of the fringe capacitor. In examples, the fringe capacitor does not have fingers formed in any unidirectional metal layers with an orientation of a preferred direction orthogonal (e.g., perpendicular) to the selected orientation of the preferred direction of the plurality of unidirectional metal layers. In examples, the fingers in the bidirectional metal layers and unidirectional metal layers of the semiconductor die may be oriented in a same direction so that the fingers have a regular pattern. Further, fingers may be included in a same position in each layer of the fringe capacitor with fingers so that those layers have a regular pattern. Similarly, fingers may not be located in a same position in each layer of the fringe capacitors so that those layers have a regular pattern.

Figure 5:
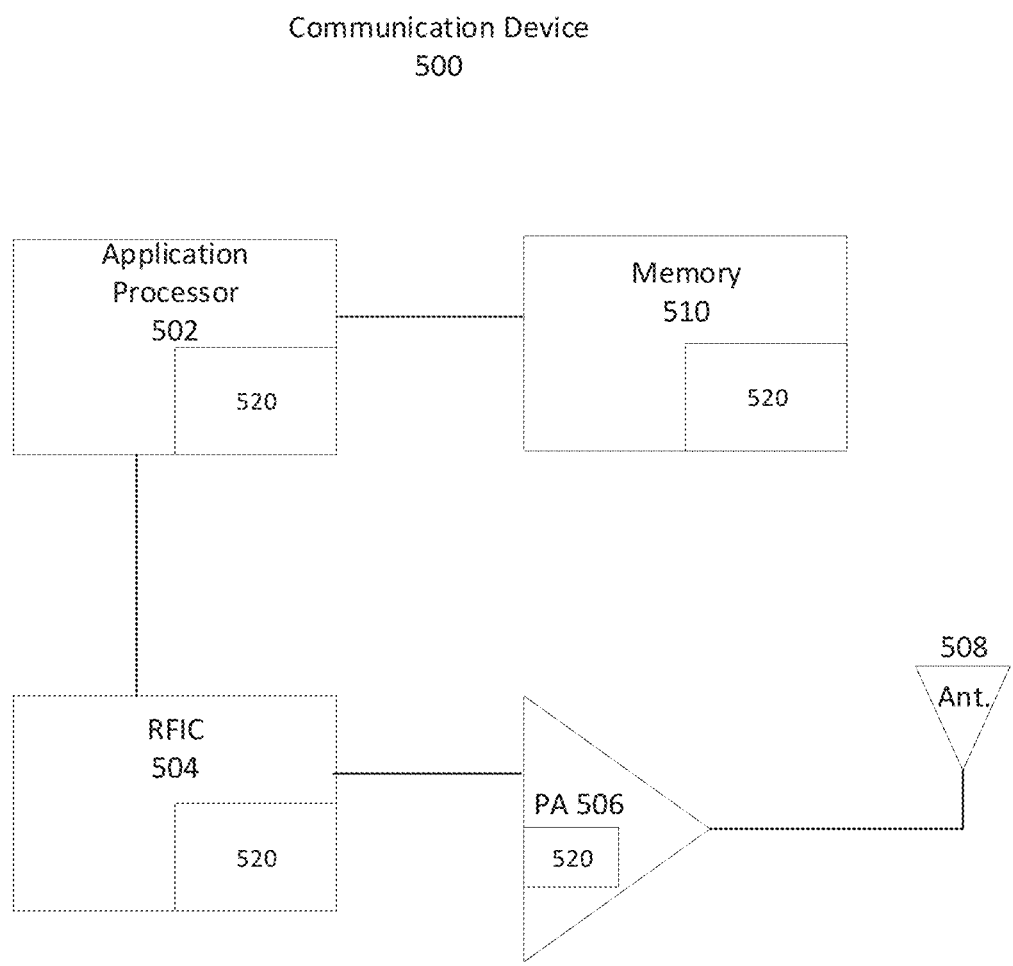
FIG. 5 illustrates an example communication device in which embodiments of the example fringe capacitor could be found.

FIG. 5 illustrates an example communication device 500 in which embodiments of the example fringe capacitor 520 could be found. The communication device 500 may be a mobile terminal or base station. Shown in FIG. 5 are an application processor 502, a radio frequency integrated circuit (RFIC) 504, a power amplifier (PA) 506, a radio frequency (RF) antenna 508, and a memory 510 which may have the fringe capacitor 520. The fringe capacitor 520 may find application in one or more of the components illustrated in FIG. 5 which in this example is shown to be in the application processor 502, RFIC 504, PA 506, and memory 510. For simplicity, not all components typically found in a communication device are illustrated in FIG. 5. Further, the fringe capacitor 520 may be used in other types of devices.

In one embodiment, a fringe capacitor is disclosed. The fringe capacitor comprises: a plurality of unidirectional metal layers having a preferred direction and a non-preferred direction, wherein an orientation of the preferred direction of each of the unidirectional metal layers is in a same direction; first fingers of the fringe capacitor formed in a first layer of the plurality of unidirectional metal layers, the first fingers having a direction parallel to the orientation of the preferred direction; and second fingers of the fringe capacitor formed in a second layer of the plurality of unidirectional metal layers, the second fingers having a direction parallel to the orientation of the preferred direction, the first layer and the second layer separated by at least a metal layer not having the orientation of the preferred direction and not having fingers of the fringe capacitor. In an embodiment, the metal layer not having the orientation of the preferred direction and not having fingers of the fringe capacitor is adjacent to the first layer and the second layer. In an embodiment, the first fingers and the second fingers have a regular pattern on the first layer and the second layer. In an embodiment, one or more of the fingers of the fringe capacitor formed in each of the first and second layers comprise one or more fingers with a polarity and one or more floating fingers. In an embodiment, the one or more floating fingers are positioned around a periphery of the one or more fingers with the polarity. In an embodiment, conductive structures of the plurality of unidirectional metal layers are electrically coupled together through a via in an inter-dielectric layer located between metal layers. In an embodiment, the preferred direction has a smaller feature size than the non-preferred direction associated with a unidirectional layer of the plurality of unidirectional layers. In an embodiment, the plurality of metal layers further comprises one or more bidirectional metal layers; and wherein third fingers of the fringe capacitor are formed in a bidirectional metal layer of the one or more bidirectional metal layers, the third fingers having a direction parallel to the orientation of the preferred direction. In an embodiment, the one or more bidirectional layers are arranged below the plurality of unidirectional layers. In an embodiment, the preferred direction and the non-preferred direction are perpendicular to each other. In an embodiment, an inter-dielectric layer is sandwiched in between a pair of the plurality of unidirectional metal layers.

In another embodiment, a semiconductor die is disclosed. The semiconductor die comprises: a substrate; one or more bidirectional metal layers; a plurality of unidirectional metal layers having a preferred direction and a non-preferred direction, wherein an orientation of the preferred direction of each of the unidirectional metal layers is in a same direction; fingers of the fringe capacitor formed in each of the plurality of unidirectional metal layers, the fingers of the plurality of unidirectional metal layers being interdigitated and having a direction parallel to the orientation of the preferred direction, wherein the fingers comprise one or more fingers with a polarity and one or more floating fingers positioned around a periphery of the one or more fingers associated with the polarity, the plurality of unidirectional metal layers separated by at least a unidirectional layer not having the orientation of the preferred direction and not having fingers of the fringe capacitor; and fingers of the fringe capacitor formed in each of the one or more bidirectional metal layers, the fingers of the one or more bidirectional metal layers being interdigitated and having a direction parallel to the orientation of the preferred direction. In an embodiment, the preferred direction has a smaller feature size than the non-preferred direction associated with a unidirectional layer of the plurality of unidirectional layers. In an embodiment, the fingers have a regular pattern over the metal layers. In an embodiment, the unidirectional metal layer of the fringe capacitor not having the orientation of the preferred direction and not having fingers of the fringe capacitor is adjacent to another unidirectional metal layer having fingers of the fringe capacitor. In an embodiment, conductive structures of the plurality of unidirectional metal layers are electrically coupled together through a via in an inter-dielectric layer located between unidirectional metal layers. In an embodiment, the one or more bidirectional layers are arranged below the plurality of unidirectional layers. In an embodiment, the preferred direction and the non-preferred direction are perpendicular to each other. In an embodiment, the semiconductor die comprises a semiconductor device coupled to the fringe capacitor. In an embodiment, a communication system comprising the semiconductor die.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

The invention is not to be limited to the specific forms or arrangements of parts so described and illustrated although specific embodiments of the invention have been described and illustrated. The scope of the invention is to be defined by the claims appended hereto and their equivalents.

What is claimed is:

1. A fringe capacitor comprising:
   a plurality of metal layers each having a first feature size in a preferred direction and a second feature size in a non-preferred direction, wherein an orientation of the preferred direction of each of unidirectional metal layers is in a same direction and the first feature size is less than the second feature size;
   first fingers of the fringe capacitor formed in a first layer of the plurality of unidirectional metal layers, the first fingers having a direction parallel to the orientation of the preferred direction and configured for alternating polarity; and
   second fingers of the fringe capacitor formed in a second layer of the plurality of unidirectional metal layers, the second fingers having a direction parallel to the orientation of the preferred direction and configured for alternating polarity, the first layer and the second layer separated by at least a metal layer with the preferred direction not having the same orientation of the preferred direction of the first layer and the second layer and not having any fingers configured for alternating polarity formed thereon;
   wherein the metal layers are stacked together to form the fringe capacitor.

2. The fringe capacitor of claim 1, wherein the metal layer not having the orientation of the preferred direction and not having fingers of the fringe capacitor is adjacent to the first layer and the second layer.

3. The fringe capacitor of claim 1, wherein the first fingers and the second fingers have a regular pattern in the first layer and the second layer.

4. The fringe capacitor of claim 1, wherein one or more of the fingers of the fringe capacitor formed in each of the first and second layers comprise one or more fingers configured with a polarity and one or more floating fingers in a same layer.

5. The fringe capacitor of claim 4, wherein the one or more floating fingers are positioned around a periphery of the one or more fingers with the polarity.

6. The fringe capacitor of claim 1, wherein conductive structures of the plurality of unidirectional metal layers are electrically coupled together through a via in an inter-dielectric layer located between metal layers.

7. The fringe capacitor of claim 1, wherein the plurality of metal layers further comprises one or more bidirectional metal layers; and wherein third fingers of the fringe capacitor are formed in a bidirectional metal layer of the one or more bidirectional metal layers, the third fingers having a direction parallel to the orientation of the preferred direction and the bidirectional layer comprises a same feature size in a preferred direction and a non-preferred direction which are perpendicular to each other.

8. The fringe capacitor of claim 7, wherein the one or more bidirectional layers are arranged below the plurality of unidirectional layers.

9. The fringe capacitor of claim 1, wherein the preferred direction and the non-preferred direction are perpendicular to each other.

10. The fringe capacitor of claim 1, wherein an inter-dielectric layer is sandwiched in between a pair of the plurality of unidirectional metal layers.

11. A semiconductor die comprising:
    a substrate;
    one or more bidirectional metal layers;
    a plurality of metal layers each having a first feature size in a preferred direction and a second feature size in a non-preferred direction, wherein an orientation of the preferred direction of each of unidirectional metal layers is in a same direction and the first feature size is less than the second feature size;
    fingers of the fringe capacitor formed in each of the plurality of unidirectional metal layers and configured for alternating polarity, the fingers of the plurality of unidirectional metal layers being interdigitated and having a direction parallel to the orientation of the preferred direction and configured for alternating polarity, wherein the fingers in a layer comprise one or more fingers with flail the polarity and one or more floating fingers positioned around a periphery of the one or more fingers associated with the polarity in the same layer, the plurality of unidirectional metal layers separated by at least a unidirectional layer with the preferred direction not having the same orientation of the preferred direction of the first layer and the second layer and not having any fingers configured for alternating polarity formed thereon; and
    fingers of the fringe capacitor formed in each of the one or more bidirectional metal layers, the fingers of the one or more bidirectional metal layers being interdigitated and having a direction parallel to the orientation of the preferred direction, the bidirectional layer comprises a same feature size in a preferred direction and a non-preferred direction which are perpendicular;
    wherein the metal layers are stacked together.

12. The semiconductor die of claim 11, wherein the fingers have a regular pattern over the metal layers.

13. The semiconductor die of claim 11, wherein the unidirectional metal layer of the fringe capacitor with the preferred direction not having the same orientation of the preferred direction of the first layer and the second layer and not having any fingers configured for alternating polarity is adjacent to the unidirectional metal layer having fingers of the fringe capacitor.

14. The semiconductor die of claim 11, wherein conductive structures of the plurality of unidirectional metal layers are electrically coupled together through a via in an inter-dielectric layer located between unidirectional metal layers.

15. The semiconductor die of claim 11, wherein the one or more bidirectional layers are arranged below the plurality of unidirectional layers.

16. The semiconductor die of claim 11, wherein the preferred direction and the non-preferred direction are perpendicular to each other.

17. The semiconductor die of claim 11, wherein the semiconductor die comprises a semiconductor device coupled to the fringe capacitor.

18. A communication system comprising the semiconductor die of claim 11.

* * * * *